United States Patent
King et al.

(10) Patent No.: US 10,153,736 B2
(45) Date of Patent: Dec. 11, 2018

(54) CIRCUITS AND METHODS FOR 2G AMPLIFICATION USING 3G/4G LINEAR PATH COMBINATION

(71) Applicant: SKYWORKS SOLUTIONS, INC., Woburn, MA (US)

(72) Inventors: Joel Richard King, Newbury Park, CA (US); Hyeong Tae Jeong, Westlake Village, CA (US); Nick Cheng, Thousand Oaks, CA (US); Weiheng Chang, Thousand Oaks, CA (US); Doel Roy, Thousand Oaks, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 92 days.

(21) Appl. No.: 14/827,534

(22) Filed: Aug. 17, 2015

(65) Prior Publication Data
US 2016/0191105 A1    Jun. 30, 2016

Related U.S. Application Data

(60) Provisional application No. 62/038,322, filed on Aug. 17, 2014, provisional application No. 62/038,323, filed on Aug. 17, 2014.

(51) Int. Cl.
*H04W 88/06* (2009.01)
*H03F 1/02* (2006.01)
(Continued)

(52) U.S. Cl.
CPC ............. *H03F 1/0277* (2013.01); *H03F 3/19* (2013.01); *H03F 3/191* (2013.01); *H03F 3/195* (2013.01);
(Continued)

(58) Field of Classification Search
CPC .......... H03F 1/0277; H03F 3/19; H03F 3/191; H03F 3/195; H03F 3/211; H03F 3/213;
(Continued)

(56) References Cited

U.S. PATENT DOCUMENTS

| | | | |
|---|---|---|---|
| 8,457,685 B1 * | 6/2013 | Bauder | H04B 1/18 455/553.1 |
| 2009/0045877 A1 | 2/2009 | Wang et al. | |

(Continued)

FOREIGN PATENT DOCUMENTS

| | | |
|---|---|---|
| CN | 201510505346.1 | 8/2015 |
| EP | 15181220.3 | 8/2015 |

(Continued)

*Primary Examiner* — Ankur Jain
(74) *Attorney, Agent, or Firm* — Chang & Hale LLP

(57) ABSTRACT

Circuits and methods for 2G amplification using 3G/4G linear path combination. In some embodiments, a front-end architecture can include a first amplification path and a second amplification path, with each being configured to amplify a 3G/4G signal, and the first amplification path including a phase shifting circuit. The front-end architecture can further include a splitter configured to receive a 2G signal and split the 2G signal into the first and second amplification paths, and a combiner configured to combine amplified 2G signals from the first and second amplification paths into a common output path. The front-end architecture can further include an impedance transformer implemented along the common output path to provide a desired impedance for the combined 2G signal.

19 Claims, 11 Drawing Sheets

(51) Int. Cl.

| | | |
|---|---|---|
| *H03F 3/191* | (2006.01) | |
| *H03F 3/21* | (2006.01) | |
| *H03F 3/24* | (2006.01) | |
| *H03F 3/72* | (2006.01) | |
| *H04B 1/18* | (2006.01) | |
| *H03F 3/19* | (2006.01) | |
| *H03F 3/195* | (2006.01) | |
| *H03F 3/213* | (2006.01) | |
| *H04B 1/00* | (2006.01) | |
| *H04B 1/401* | (2015.01) | |

(52) U.S. Cl.
CPC .............. *H03F 3/211* (2013.01); *H03F 3/213* (2013.01); *H03F 3/245* (2013.01); *H03F 3/72* (2013.01); *H04B 1/0053* (2013.01); *H04B 1/18* (2013.01); *H04B 1/401* (2013.01); *H03F 2200/111* (2013.01); *H03F 2200/225* (2013.01); *H03F 2200/231* (2013.01); *H03F 2200/451* (2013.01); *H03F 2200/541* (2013.01); *H03F 2203/21109* (2013.01); *H03F 2203/21139* (2013.01); *H03F 2203/21142* (2013.01); *H03F 2203/21145* (2013.01); *H03F 2203/7209* (2013.01); *H03F 2203/7215* (2013.01)

(58) Field of Classification Search
CPC ...... H03F 3/245; H03F 3/72; H03F 2200/111; H03F 2200/225; H03F 2200/231; H03F 2200/451; H03F 2200/541; H03F 2203/21109; H04B 1/0053; H04B 1/18; H04B 1/401

See application file for complete search history.

(56) References Cited

U.S. PATENT DOCUMENTS

| | | | |
|---|---|---|---|
| 2013/0113575 A1* | 5/2013 | Easter | H01P 1/15 |
| | | | 333/103 |
| 2013/0273859 A1 | 10/2013 | King et al. | |
| 2014/0313947 A1* | 10/2014 | Ali-Ahmad | H04L 5/18 |
| | | | 370/278 |
| 2015/0072671 A1* | 3/2015 | Rofougaran | H04B 1/44 |
| | | | 455/418 |
| 2015/0084715 A1* | 3/2015 | Jones | H03F 3/195 |
| | | | 333/109 |
| 2015/0303971 A1* | 10/2015 | Reisner | H04B 1/0458 |
| | | | 455/77 |
| 2016/0006476 A1* | 1/2016 | El-Rayis | H04B 1/48 |
| | | | 455/78 |

FOREIGN PATENT DOCUMENTS

| | | |
|---|---|---|
| JP | 2015-160631 | 8/2015 |
| TW | 104126768 | 8/2015 |
| WO | 2011066861 A1 | 6/2011 |

\* cited by examiner

CIRCUITS AND METHODS FOR 2G AMPLIFICATION USING 3G/4G LINEAR PATH COMBINATION

CROSS-REFERENCE TO RELATED APPLICATION(S)

This application claims priority to U.S. Provisional Application Nos. 62/038,322 filed Aug. 17, 2014, entitled CIRCUITS AND METHODS FOR 2G AMPLIFICATION USING 3G/4G LINEAR PATH COMBINATION, and 62/038,323 filed Aug. 17, 2014, entitled POWER AMPLIFIER INTERFACE COMPATIBLE WITH INPUTS SEPARATED BY MODE OR FREQUENCY, the disclosure of each of which is hereby expressly incorporated by reference herein in its entirety.

BACKGROUND

Field

The present disclosure relates to 2G amplification using 3G/4G path combination.

Description of the Related Art

Many wireless devices are configured to support current telecommunication standards, as well as one or more older standards. For example, many 3G/4G devices are configured to support 2G cellular standard.

SUMMARY

According to some implementations, the present disclosure relates to a front-end architecture that includes a first amplification path and a second amplification path, with each being configured to amplify a 3G/4G signal, and the first amplification path including a phase shifting circuit. The front-end architecture further includes a splitter configured to receive a 2G signal and split the 2G signal into the first and second amplification paths, and a combiner configured to combine amplified 2G signals from the first and second amplification paths into a common output path. The front-end architecture further includes an impedance transformer implemented along the common output path to provide a desired impedance for the combined 2G signal.

In some embodiments, the splitter can include a first switch between a common input and the first amplification path, and a second switch between the common input and the second amplification path. Each of the first and second switches can be closed when the 2G signal is received and split into the first and second amplification paths.

In some embodiments, each of the first and second amplification paths can include a power amplifier (PA). The phase shifting circuit can be on the input side of the PA. The phase shifting circuit can include an inductance and a capacitance that couples each end of the inductance to ground.

In some embodiments, each of the first and second amplification paths can include an output matching network (OMN). In some embodiments, both OMNs can be implemented as an integrated passive device (IPD). In some embodiments, each OMN can include an inductance and a capacitance that couples the output side of the inductance to ground.

In some embodiments, the combiner can be part of a band selection switch on the output side of the PAs of the first and second amplification paths. The band selection switch can include a pole connected to each of the first and second amplification paths. The pole connected to the corresponding amplification path can be an existing pole for 3G/4G operation. The band selection switch can further include a throw connected to the impedance transformer. The band selection switch can be configured to connect each pole associated with the corresponding amplification path to the throw associated with the impedance transformer.

In some embodiments, the impedance transformer can include a first inductance and a second inductance connected in series, a first capacitance that couples a node between the first and second inductances to ground, and a second capacitance that couples the output side of the second inductance to ground.

In some embodiments, the first and second amplification paths can be configured to amplify low band (LB) and very low band (VLB) 3G/4G signals, respectively. The 2G signal can have a frequency in, for example, a range between 820 MHz and 920 MHz. The 2G signal can include a signal in, for example, a GSM850 band or an EGSM900 band.

In some teachings, the present disclosure relates to a method for amplifying a 2G signal. The method includes splitting the 2G signal to yield a split signal into each of a first amplification path and a second amplification path, with each of the first and second amplification paths being configured to amplify a 3G/4G signal. The method further includes phase shifting the split signal in the first amplification path, and amplifying the split signal in each of the first and second amplification paths. The method further includes combining the amplified signals from the first and second amplification paths to yield a combined signal, and providing a desired impedance transformation for the combined signal.

In some embodiments, the amplifying can include providing a supply voltage to a power amplifier (PA) in each of the first and second amplification paths. In some embodiments, the method can further include adjusting the supply voltage to increase the saturated power level (Psat) of the amplified 2G signal. The adjusting can include increasing the supply voltage.

In a number of implementations, the present disclosure relates to a front-end module (FEM) that includes a packaging substrate configured to receive a plurality of components, and a power amplifier (PA) die mounted on the packaging substrate. The PA die includes a first amplification path and a second amplification path, with each being configured to amplify a 3G/4G signal, and the first amplification path including a phase shifting circuit. The FEM further includes a splitter configured to receive a 2G signal and split the 2G signal into the first and second amplification paths, and a band selection switch configured to combine amplified 2G signals from the first and second amplification paths into a common output path. The FEM further includes an impedance transformer implemented along the common output path to provide a desired impedance for the combined 2G signal.

In some embodiments, the PA die or the FEM can be substantially free of a 2G amplification path for amplifying the 2G signal. In some embodiments, the FEM can be substantially free of a 2G matching network for associated with the 2G amplification path.

According to some teachings, the present disclosure relates to a wireless device that includes a transceiver configured to generate a radio-frequency (RF) signal, and a front-end architecture in communication with the transceiver. The front-end architecture is configured to process 3G/4G signals, and includes a first amplification path and a second amplification path, with each being configured to amplify a 3G/4G signal, and the first amplification path including a phase shifting circuit. The front-end architecture further includes a splitter configured to receive a 2G signal and split the 2G signal into the first and second amplification paths, and a combiner configured to combine amplified 2G signals from the first and second amplification paths into a common output path. The front-end architecture further includes an impedance transformer implemented along the common output path to provide a desired impedance for the combined 2G signal. The wireless device further includes an antenna in communication with the front-end architecture, and configured to facilitate transmission of the amplified 2G signal.

In some embodiments, the wireless device can be a cellular phone. In some embodiments, the cellular phone can be a 3G/4G device having 2G capability. In some embodiments, the cellular phone can be capable of operating in a GSM850 band or an EGSM900 band.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Support for 2G configurations such as GMSK/8PSK transmit radio-frequency (RF) paths in the front-end of multi-mode multi-band (MMMB) cellular devices has conventionally required dedicated power amplifier (PA) RF blocks in order to address efficiency and target output power requirements. Low band (LB) 2G (e.g., Low Band GSM850 and EGSM900) is especially challenging, as it typically requires 33 dBm output power at a cellular antenna, whereas a peak power of a typical linear 3G/4G power amplifier (PA) may be closer to 27 dBm. It is also noted that design factors such as active die area, output match and connectivity can have substantive impact to area and/or cost of such front-ends.

In some applications, 2G support can be achieved through the use of dedicated 2G PAs and radio-frequency (RF) paths with some impact to cost and/or size. For example, an overall size associated with 2G PA transistors can be more than double the size of 3G PA transistors.

In other applications, use of electrical re-sizing of 3G/4G linear path can be utilized. However, such a technique typically involves adjustment of lossy DC-DC converter supply voltage and/or load impedance switching that can result in poor DC consumption performance and negative impact on the 3G/4G linear path efficiency and/or linearity.

Figure 1:
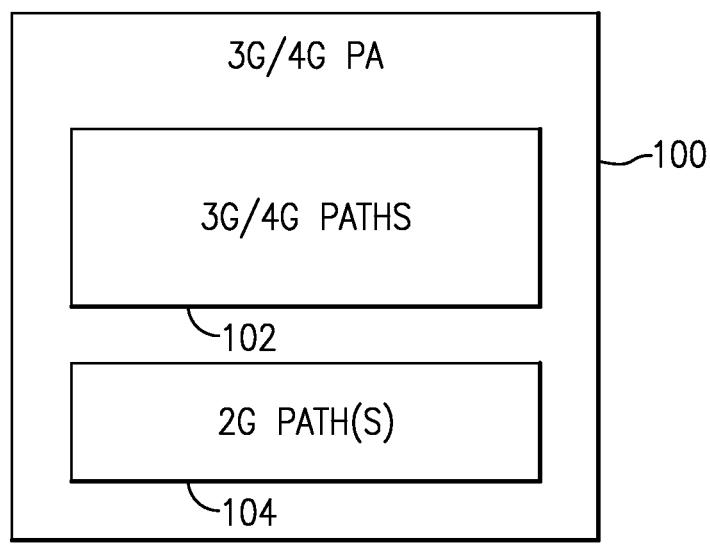
FIG. 1 depicts a 3G/4G front-end architecture that can accommodate one or more 2G amplification paths.

FIG. 1 shows that in some implementations, the present disclosure relates to a 3G/4G front-end architecture 100 that can accommodate one or more 2G amplification paths 104. Such an architecture can include a plurality of 3G/4G amplification paths 102 to provide, for example, MMMB functionalities.

In some embodiment, and as described herein, the 2G amplification path(s) 104 of FIG. 1 can be configured to utilize existing 3G/4G linear transmit paths and PA stages that are designed, optimized, and appropriately-sized for 3G/4G performance (e.g., linearity and efficiency). Various non-limiting examples of such 2G amplification path(s) are described herein in greater detail.

Figure 2:
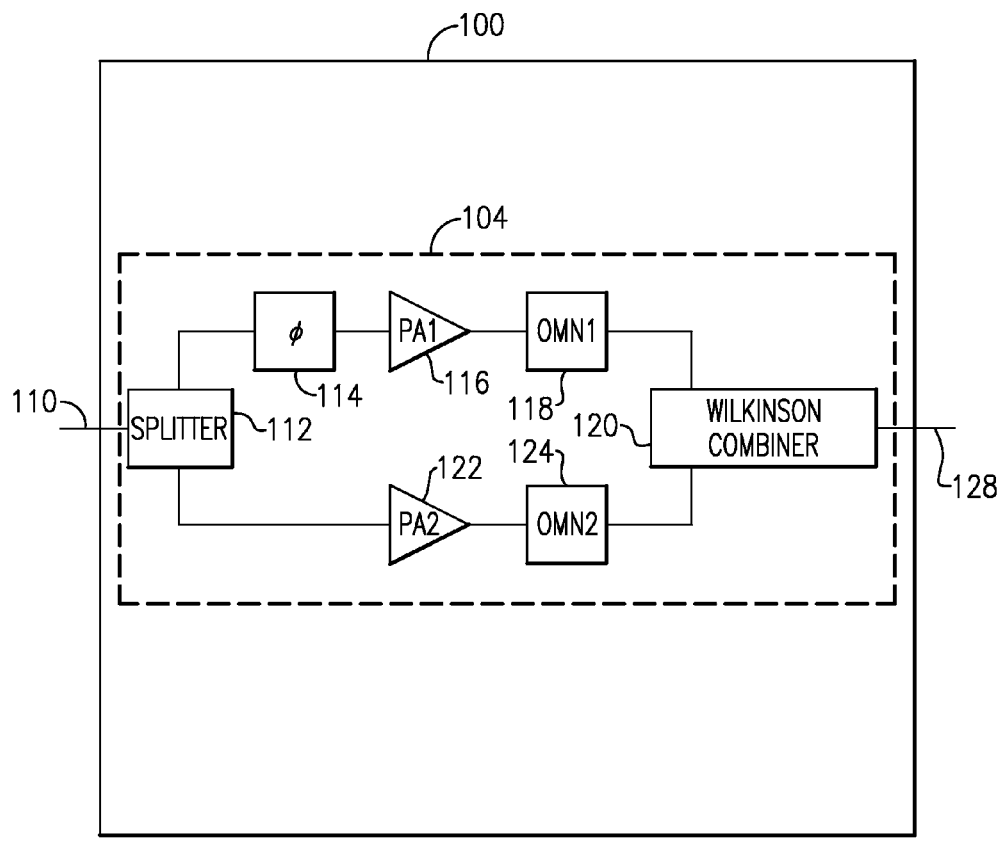
FIG. 2 shows an example of a 2G path that can utilize components that are parts of a 3G/4G architecture.

FIG. 2 shows an example of a 2G path 104 that can utilize components that are parts of a 3G/4G architecture 100. In the example of FIG. 2, a first path that includes a PA 116 (PA1) and an output matching network 118 (OMN1) is a 3G/4G path. Similarly, a second path that includes a PA 122 (PA2) and an output matching network 124 (OMN2) is a 3G/4G path. In various examples herein, such first and second 3G/4G paths are described in an example context of low band (LB) and very low band (VLB) paths. However, it will be understood that one or more features of the present disclosure can also be implemented with path(s) associated with other frequency bands.

In the example of FIG. 2, the 2G path 104 can include an input 110 configured to receive a 2G signal (e.g., Low Band GSM850 or EGSM900). Such a signal can be divided by a splitter 112 into the first path associated with PA1 and the second path associated with PA2. The first path is shown to include a phase shifting circuit 114 before PA1, and the output matching network OMN1 after PA1. The second path is shown to include the output matching network OMN2 after PA2. The two paths are shown to be combined by a Wilkinson combiner 120 so as to yield an output 128 for the amplified 2G signal.

Figure 3:
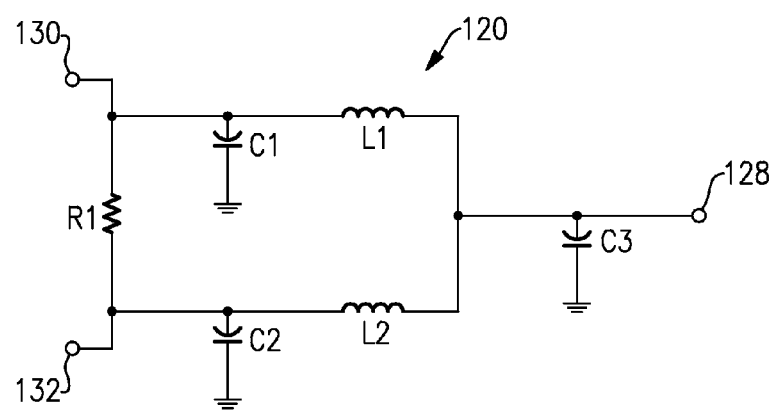
FIG. 3 shows an example of a combiner that can be utilized in the example of FIG. 2.

FIG. 3 shows an example of the Wilkinson combiner 120 of FIG. 2. First and second nodes 130, 132 can be connected to the outputs of OMN1 and OMN2, respectively, of FIG. 2. Such two nodes (130, 132) are shown to be resistively coupled through resistance R1. The first node 130 is shown to be coupled to ground through capacitance C1, and the second node 132 is shown to be coupled to ground through capacitance C2. Inductances L1 and L2 in series with each other and collectively parallel with R1 are shown to couple the first and second nodes 130, 132, such that the output 128 is at a node between L1 and L2. The output node 128 is shown to be coupled to ground through capacitance C3.

It is noted that in the example of FIG. 2, the splitter 112 (e.g., one or more switches) can be configured so that a given 2G signal is routed to the first path only, to the second path only, or to both of the first and second paths. With such routing options, and in the example context of the first and second paths being 3G/4G LB and VLB paths, Table 1 lists examples of saturated power level (Psat) performance that can be obtained or expected for the configuration of FIGS. 2 and 3 (with or without the Wilkinson combiner), when a 2G signal (824 MHz or 915 MHz) is amplified.

TABLE 1

| Path(s) used | Psat (dBm) at 824 MHz | Psat (dBm) at 915 MHz | Phase compensation (degrees) |
|---|---|---|---|
| VLB only | 31.9 | 32.7 | N/A |
| LB only | 30.8 | 31.3 | N/A |
| VLB and LB (calculated) | 34.4 | 35.1 | N/A |
| VLB and LB with lossless Wilkinson combiner | 34.8 | 34.9 | Ideal phase shift of 290 degrees at the input of LB |

Following observations can be made in reference to Table 1. The "VLB only" case showed higher Psat than the "LB only" case in the simulation bench due to lower loadline. The lossless Wilkinson combiner (120 in FIG. 3) was modeled with ideal resistor, inductors and capacitors (R1=100 ohms, C1=C2=2.6 pF, L1=L2=13 nH, C3=5.1 pF). Accordingly, in some embodiments, the foregoing design that utilizes a Wilkinson combiner can include at least four SMT components, a resistor having high power rating, and two extra switch arms (e.g., to split the incoming 2G signal).

Figure 4:
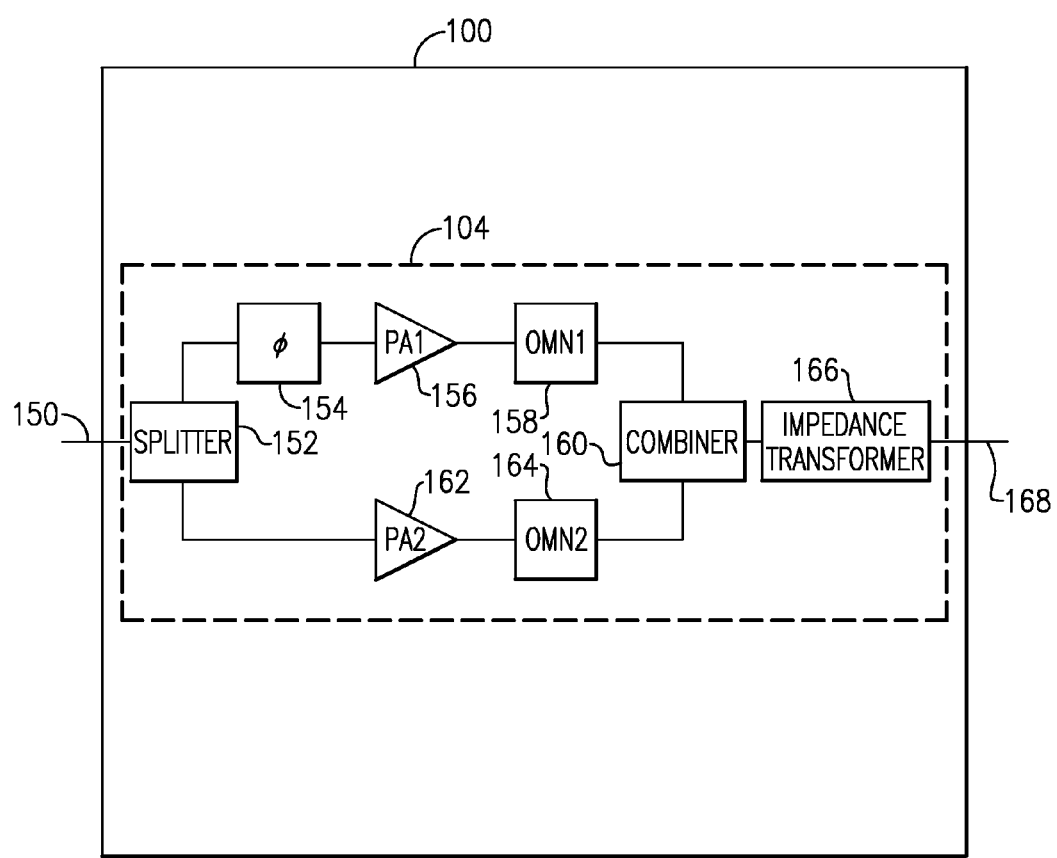
FIG. 4 shows another example of a 2G path that can utilize components that are parts of a 3G/4G architecture.

FIG. 4 shows an example of a 2G path 104 that can utilize components that are parts of a 3G/4G architecture 100. In the example of FIG. 4, an additional shared throw can be implemented on an existing post-PA band-select switch to allow two low band 3G/4G amplifiers to be simultaneously connected to a common output pole of the post-PA band-select switch. From such an output pole, an impedance transformation network can be provided to optimally combine the outputs of the two PAs, to thereby reach a larger output power specification typically associated with 2G low bands. Further, the post-PA band select switch can effectively isolate the foregoing combiner network from other 3G/4G optimized PAs and related paths; accordingly, there is little or no impact on the performance of various 3G/4G operations.

Referring to the example of FIG. 4, a first path that includes a PA 156 (PA1) and an output matching network 158 (OMN1) is a 3G/4G path. Similarly, a second path that includes a PA 162 (PA2) and an output matching network 164 (OMN2) is a 3G/4G path. In various examples herein, such first and second 3G/4G paths are described in an example context of low band (LB) and very low band (VLB) paths. However, it will be understood that one or more features of the present disclosure can also be implemented with path(s) associated with other frequency bands.

In the example of FIG. 4, the 2G path 104 can include an input 150 configured to receive a 2G signal (e.g., Low Band GSM850 or EGSM900). Such a signal can be divided by a splitter 152 into the first path associated with PA1 and the second path associated with PA2. The first path is shown to include a phase shifting circuit 154 before PA1, and the output matching network OMN1 after PA1. The second path is shown to include the output matching network OMN2 after PA2. The two paths are shown to be combined by a combiner 160, and the combined path is shown to include an impedance transformer 166 configured to yield an output 168 for the amplified 2G signal.

Figure 5A:
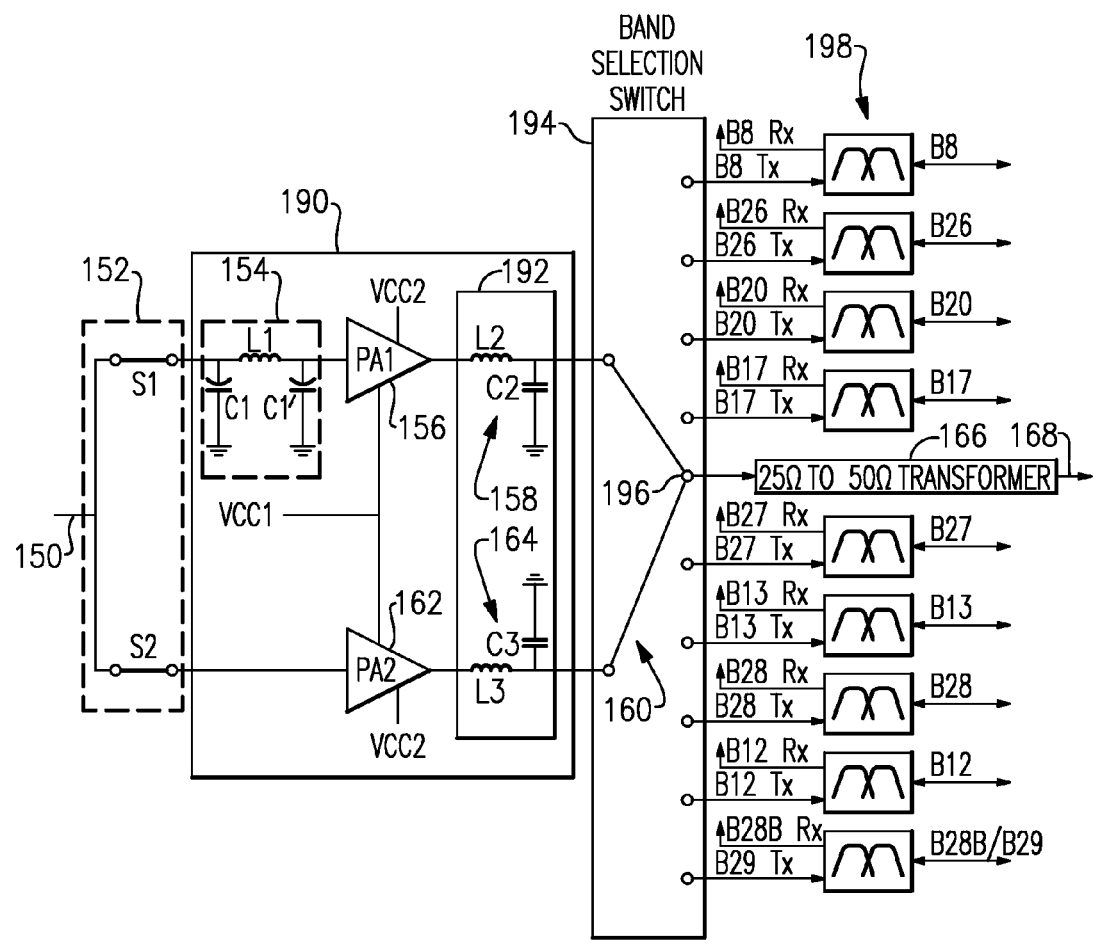
FIG. 5A shows a more specific example of the 3G/4G architecture of FIG. 4.

FIG. 5A shows a more specific example of the 3G/4G architecture 100 of FIG. 4. In FIG. 5A, the splitter 152, the phase shifting circuit 154, the OMNs 158, 164, and the combiner 160 of FIG. 4 are generally indicated with the same reference numbers.

FIG. 5A shows that in some embodiments, the splitter 152 can include first and second switches S1, S2 connected to a common input 150. The first switch S1 is shown to be in series with the phase shifting circuit 154 and the first PA 156 (PA1). The second switch S2 is shown to be in series with the second PA 162 (PA2). Accordingly, operations of the first and second switches S1, S2 can route an incoming 2G signal to the first PA (PA1) only (e.g., S1 closed, S2 open), to the second PA only (e.g., S1 open, S2 closed), or to both of the first and second PAs (PA1 and PA2) (e.g., S1 closed, S2 closed). In the example shown in FIG. 5A, S1 and S2 are both closed; accordingly, the incoming 2G signal is routed to both of the first and second PAs (PA1 and PA2).

FIG. 5A shows that in some embodiments, the phase shifting circuit 154 can include an inductance L1, with each end of L1 being coupled to ground through a capacitance (C1 or C1'). In the context of the first and second PAs (PA1 and PA2) being LB and VLB PAs, and the 2G signal being a low band signal (e.g., 824 MHz or 915 MHz), example values of L1, C1 and C1' can be as follows: L1=7.9 nH, C1=C1'=2.1 pF. Such an example configuration of the phase shifting circuit 154 can provide a phase shift of approximately 60 degrees for the low band 2G signal. It will be understood that the phase shifting circuit 154 can be configured to provide a different amount of phase shift, and/or to accommodate a different frequency signal.

FIG. 5A shows that in some embodiments, each of the first and second PAs (PA1 and PA2) can include one or more stages. For example, each PA can include a driver stage and an output stage. In such a configuration, each PA in FIG. 5A can be provided with a supply voltage VCC1 for the driver stage, and a supply voltage VCC2 for the output stage.

FIG. 5A shows that in some embodiments, both of the OMNs 158, 164 can be implemented as an integrated passive device (IPD) 192. Such an IPD can also include matching networks for other 3G/4G PAs.

FIG. 5A shows that in some embodiments, the phase shifting circuit 154, the PAs (PA1, PA2), and the IPD 192 with the OMNs 158, 164 can be considered to be functionally a PA block 190. Such a functional block can be implemented in one or more die. For example, the IPD 192 and a die with the PAs can be stacked to reduce lateral footprint size. In another example, the IPD 192 and a band selection switch 194 of FIG. 5A can be stacked. As one can see, a number of different configurations can be implemented.

FIG. 5A shows that in some embodiments, the combiner 160 of FIG. 4 can be implemented in the band selection switch 194. For example, the outputs of the OMNs 158, 164 for the first and second paths are shown to be connected to their respective poles that may or may not already exist in the band selection switch 194 for 3G/4G operations. Various throws in the band selection switch 194 are shown to be connected to their respective duplexers 198. An additional throw 196 can be provided in the band selection switch 194, and such a throw can be connected to an impedance transformer 166 as described herein. Accordingly, the band selection switch 194 can be operated to form connections between the output of the first OMN 158 and the throw 196, and between the output of the first OMN 164 and the throw 196, to thereby provide a combined path that includes the impedance transformer 166 and the output 168.

In the example of FIG. 5A, the duplexers 198 are depicted as including channels for example bands B8, B26, B20, B17, B27, B13, B28, B12, and B28B/B29. It will be understood that more or less numbers of bands, and/or other bands, can be implemented and switched through the band selection switch 194.

Figure 5B:
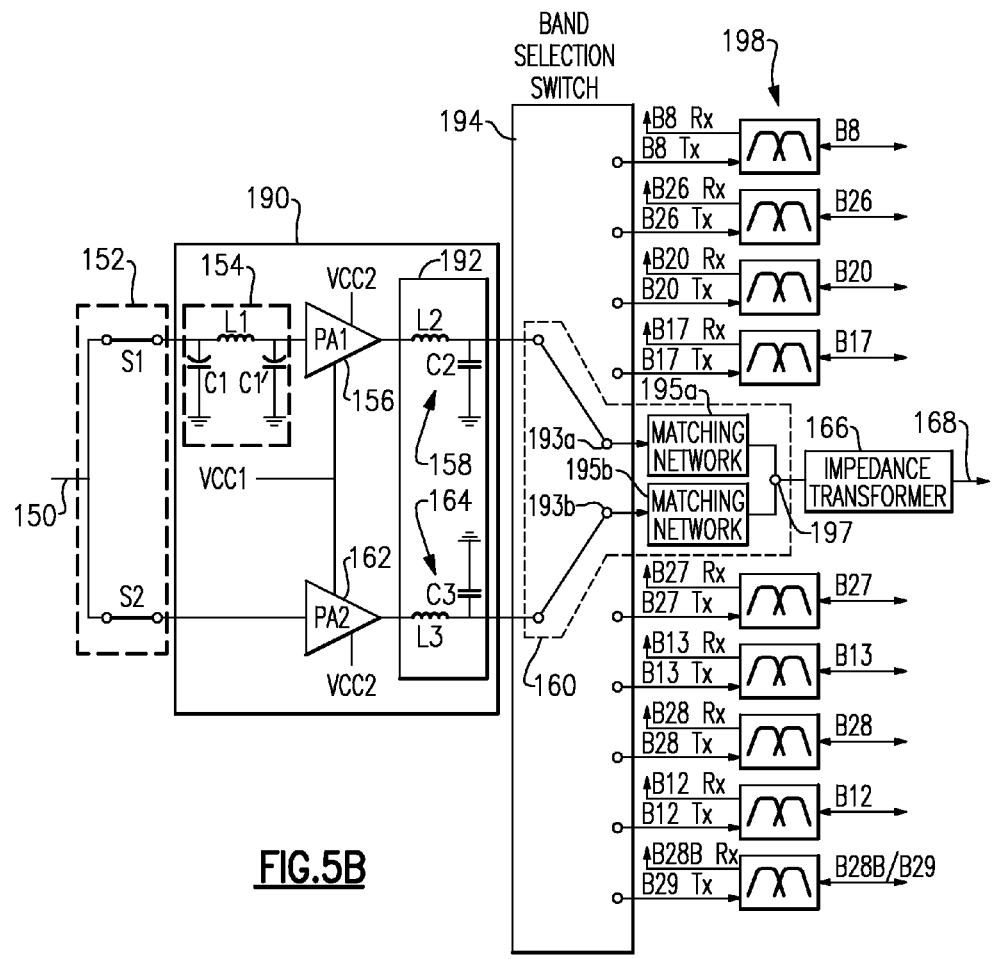
FIG. 5B shows an alternate design for the example of FIG. 5A.

FIG. 5B shows an alternate design for the example of FIG. 5A. More particularly, the example of FIG. 5B is shown to include a combiner 160 that is different than the combiner of FIG. 5A. For the purpose of description, the splitter 152, the PA block 190, and the duplexers 198 of FIG. 5B can be similar to those of FIG. 5A.

In the example of FIG. 5B, the outputs of the OMNs 158, 164 for the first and second paths are shown to be connected to their respective poles that may or may not already exist in the band selection switch 194 for 3G/4G operations, similar to the example of FIG. 5A. In the band selection switch 194 of FIG. 5B, however, there are two throws 193a, 193b that can be connected to such two poles. The throw 193a is shown to be connected to an input of a first matching network 195a, and the throw 193b is shown to be connected to an input of a second matching network 195b. Outputs of the first and second matching networks 195a, 195b are shown to be connected to a common node 197. Accordingly, the combiner in the example of FIG. 5B can include the foregoing paths between the OMNs 158, 164 and the common node 197.

In FIG. 5B, an impedance transformer 166 is shown to be implemented between the common node 197 and the output 168. Such an impedance transformer may or may not be the same as the example 25 ohm-to-50 ohm transformer of FIG. 5A.

Figure 6:
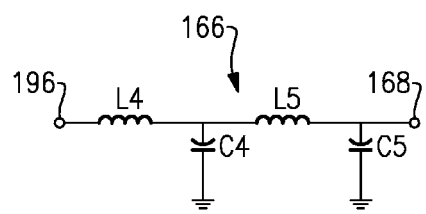
FIG. 6 shows an example circuit that can be implemented as an impedance transformer in the examples of FIGS. 5A and 5B.

FIG. 6 shows an example circuit that can be implemented as the impedance transformer 166 of FIGS. 5A and 5B. Such a circuit can include inductances L4 and L5 connected in series between the common throw 196 of the band selection switch 194 and the output 168 of FIG. 5A, and between the common node 197 and the output 168 of FIG. 5B. The impedance transformer circuit 166 is shown to further include capacitance C4 that couples a node between L4 and L5 to ground, and capacitance C5 that couples the output node 128 to ground.

In FIG. 5A, the impedance transformer 166 is depicted as providing 25 ohm (on the common node (196) side) to 50 ohm (on the output (168) side) transformation. In such an example context, values of L4, L5, C4 and C5 in FIG. 6 can be as follows. In an ideal situation, L4 can be approximately 3.74 nH, L5 can be approximately 7.91 nH, C4 can be approximately 6.33 pF, and C5 can be approximately 2.99 pF. When implemented in SMT inductors and capacitors with Q factor of about 40, L4 can be approximately 3.6 nH, L5 can be approximately 7.7 nH, C4 can be approximately 6.2 pF, and C5 can be approximately 3 pF. Such an example configuration of the impedance transformer 166 can enhance output power for the low band 2G signal processed as described herein. It will be understood that the impedance transformer 166 can be configured to provide different transformations, and/or to accommodate a different frequency signals.

It will be understood that the impedance transformer 166 of FIGS. 4-6 may be implemented using a number of other techniques, including, for example, transmission lines, lumped element reactive transformation, and transformer based on coupled coils of various winding relationships to achieve different impedance transformations. Required or desired phase and amplitude relationships between the two PA paths can be achieved through, for example, application of phase shifting and amplitude adjustment at the input of one or the other, or combinations of the stages relative to the other in order to avoid output losses. In some applications, the phase and amplitude adjustment networks can also be implemented at the output side of PA(s), with some loss penalty.

Figure 7B:
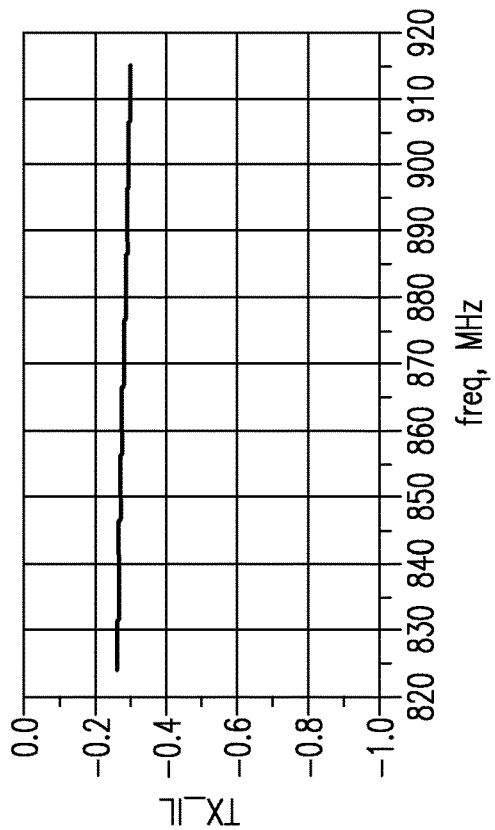
FIGS. 7A and 7B show examples of performance that can be obtained or expected with use of the impedance transformer of FIGS. 5 and 6.
Figure 7A:
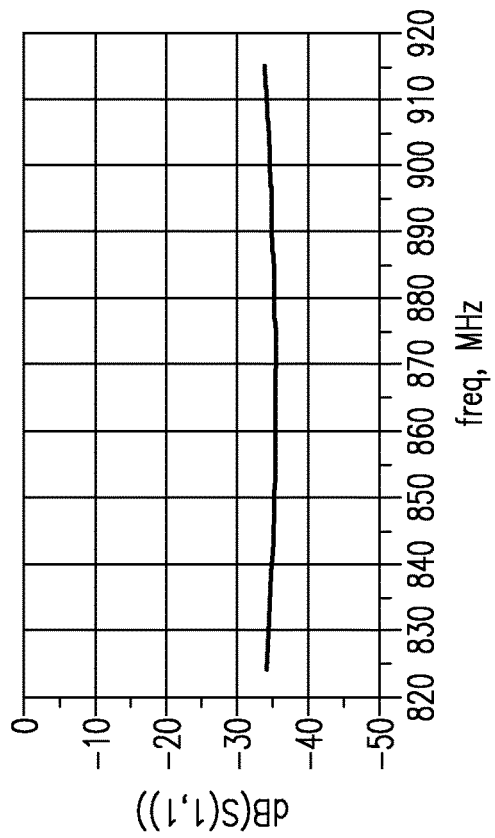

FIGS. 7A and 7B show examples of performance that can be obtained or expected with use of the impedance transformer 166 of FIGS. 5 and 6, with the foregoing SMT implementations (e.g., with Q=40). FIG. 7A shows a plot of S11 parameter (reflection coefficient) as a function of frequency, demonstrating broadband property. FIG. 7B shows a plot of insertion loss as a function of frequency, demonstrating a reasonable insertion loss of about 0.3 dB.

Figure 8:
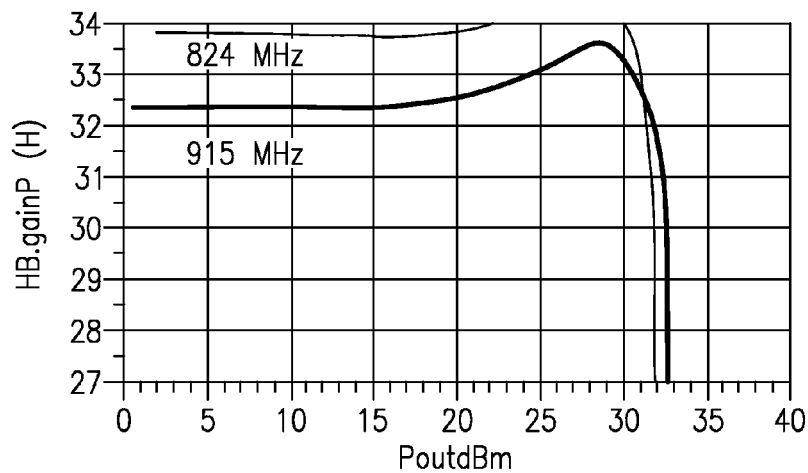
FIG. 8 show power amplification gain plots as a function of output power for the example of FIG. 2 in a configuration.
Figure 9:
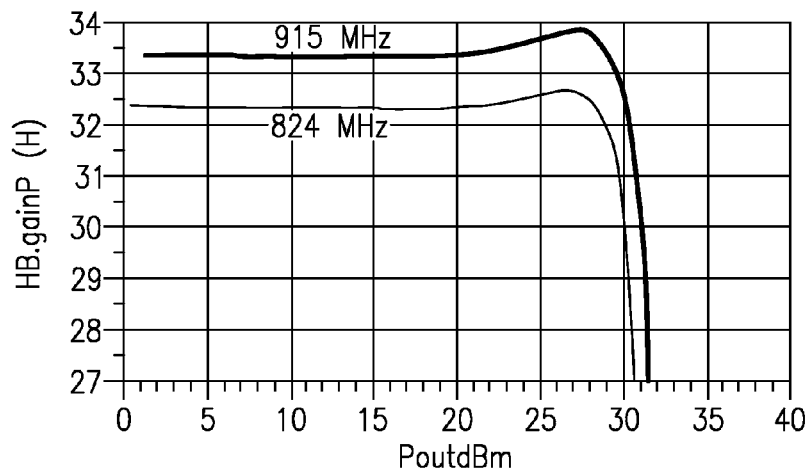
FIG. 9 show power amplification gain plots as a function of output power for the example of FIG. 2 in another configuration.
Figure 10:
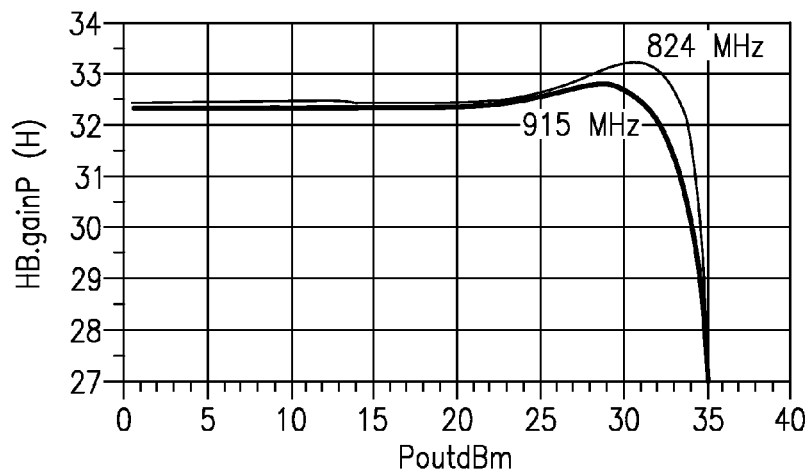
FIG. 10 show power amplification gain plots as a function of output power for the example of FIG. 2 in yet another configuration.
Figure 11:
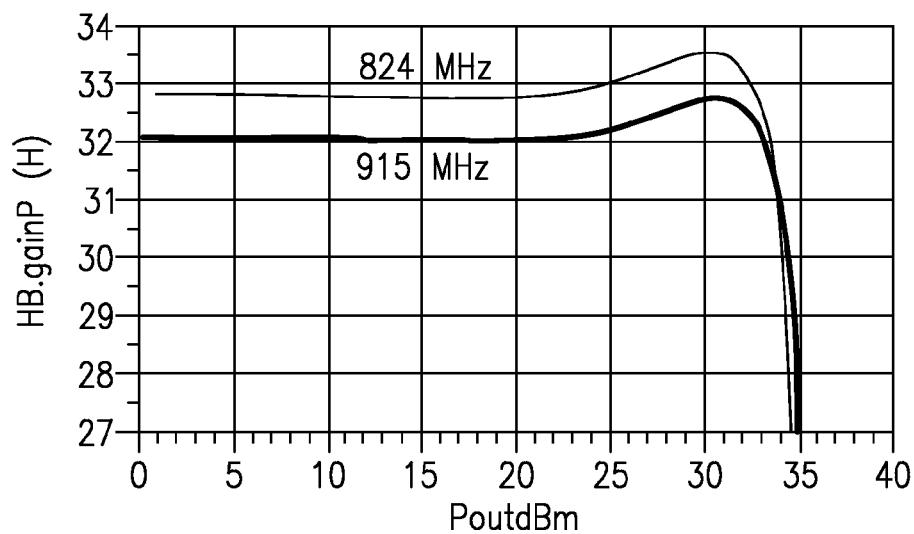
FIG. 11 show power amplification gain plots as a function of output power for the example of FIG. 5A in a configuration.
Figure 12:
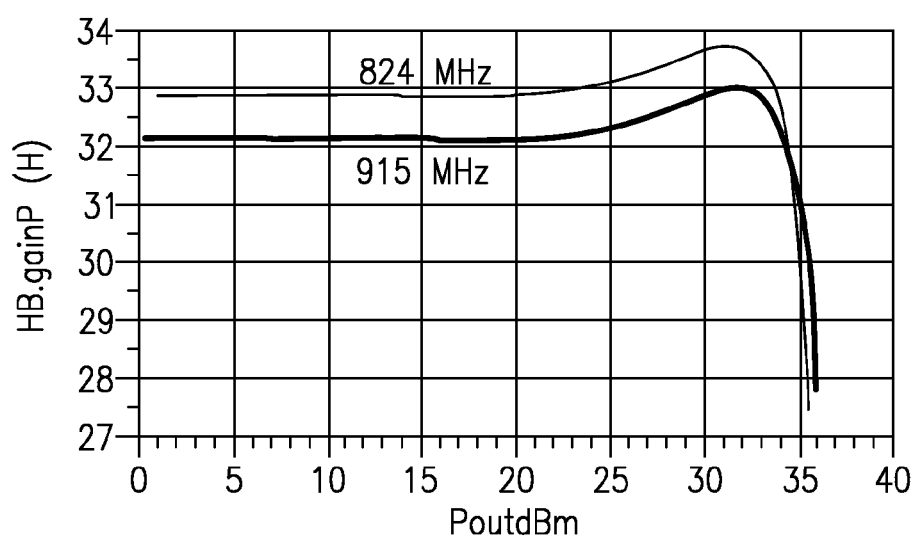
FIG. 12 show power amplification gain plots as a function of output power for the example of FIG. 5A in another configuration.

FIGS. 8-12 show power amplification gain plots as a function of output power for the various example configurations described herein. More particularly, FIG. 8 is for the example of FIG. 2, with VLB path only, after the OMN (124); FIG. 9 is for the example of FIG. 2, with LB path only (no phase shift), after the OMN (118); FIG. 10 is for the example of FIG. 2, with VLB and LB (290 degree phase shift), after the Wilkinson combiner (120); FIG. 11 is for the example of FIG. 5A, with VLB and LB (60 degree phase shift), after the impedance transformer (166) (with 0.3 dB loss), with VCC (e.g., VCC2 in FIG. 5A) at 3.4V; and FIG. 12 is for the example of FIG. 5A, with VLB and LB (60 degree phase shift), after the impedance transformer (166) (with 0.3 dB loss), with VCC increased to 3.8V. From such plots, saturated power levels (Psat) can be obtained. Table 2 includes a summary of such Psat values for the plots shown in FIGS. 8-12. It is noted that the first four rows of Table 2 are the same as Table 1. It is also noted that for the purpose of description, the example configuration of FIG. 5A is sometimes referred to herein as a load-sharing configuration when both of the first and second paths (associated with PA1 and PA2) are active.

TABLE 2

| Path(s) used | Psat (dBm) at 824 MHz | Psat (dBm) at 915 MHz | Phase compensation (degrees) |
|---|---|---|---|
| VLB only | 31.9 | 32.7 | N/A |
| LB only | 30.8 | 31.3 | N/A |
| VLB and LB (calculated) | 34.4 | 35.1 | N/A |
| VLB and LB | 34.8 | 34.9 | Ideal phase shift |

TABLE 2-continued

| Path(s) used | Psat (dBm) at 824 MHz | Psat (dBm) at 915 MHz | Phase compensation (degrees) |
|---|---|---|---|
| with lossless Wilkinson combiner | | | of 290 degrees at the input of LB |
| Load-sharing (VLB and LB) with lossless impedance transformer, with ideal lumped elements in OMNs | 34.8 | 35.2 | Ideal transmission line phase shift of 60 degrees |
| Load-sharing (VLB and LB) with lossy (0.3 dB) impedance transformer, with SMT model used for OMNs, VCC = 3.4 V | 34.5 | 34.9 | Lumped C-L-C elements, phase shift of 60 degrees |
| Load-sharing (VLB and LB) with lossy (0.3 dB) impedance transformer, with SMT model used for OMNs, VCC = 3.8 V | 35.5 | 35.9 | Lumped C-L-C elements, phase shift of 60 degrees |

Based on the performance summary of Table 2, one can see that the load-sharing configuration of FIG. 5A provides good performance similar to the level of performance provided by the lossless Wilkinson-combiner example of FIG. 2. In contrast to the Wilkinson-combiner example of FIG. 2 in which a number of SMT components as well as high-power rated resistor are likely needed (as well as the extra space to accommodate such components), the load-sharing configuration of FIG. 5A can be implemented with much less number of extra components. Accordingly, the load-sharing configuration of FIG. 5A can provide advantageous savings in cost and space.

It is noted that one or more features of the present disclosure can advantageously allow, among others, elimination of one or more dedicated 2G power amplifiers and related RF paths through efficient combination of existing paths. As described herein, such existing paths can maintain their optimal performance in the linear 3G/4G modes, as originally designed.

It is also noted that while various examples are described herein in the context of 3G/4G PAs, paths, etc., it will be understood that such PAs, paths, etc. can be configured for 3G operation, for 4G operation, or any combination thereof. It will also be understood that one or more features of the present disclosure can also be applied to configurations involving other generations of cellular standards used in the past, currently in use, to be defined and used in the future, or any combination thereof.

It is also noted that in the example described in reference to FIG. 12 and Table 2, one can see that a change in power supply VCC can affect amplification performance for 2G signals. In some situations, such an adjustment in VCC may adversely affect the 3G/4G efficiency/linearity performance. Even in such situations, trade-off in performance may be acceptable, especially when one considers that processing of 2G signals as described herein can have minimal impact on area and cost for the 3G/4G paths.

It is also noted that while various examples are described herein in the context of two parallel amplification paths in 3G/4G architectures, one or more features of the present disclosure can also be implemented in other applications. For example, multiple PA combination methods for linearization, such as Doherty techniques where differing phase adjustment and amplitude balance are applied for backed-off efficiency advantage, can utilize one or more features of the present disclosure.

It is also noted that while various examples are described in the context of two amplification paths, one or more features of the present disclosure can also be implemented in systems involving more than two amplification paths. For example, one or more features of the present disclosure can be utilized to extend the power combining advantage to much larger power levels of a combined PA using three or more PA paths.

Figure 13:
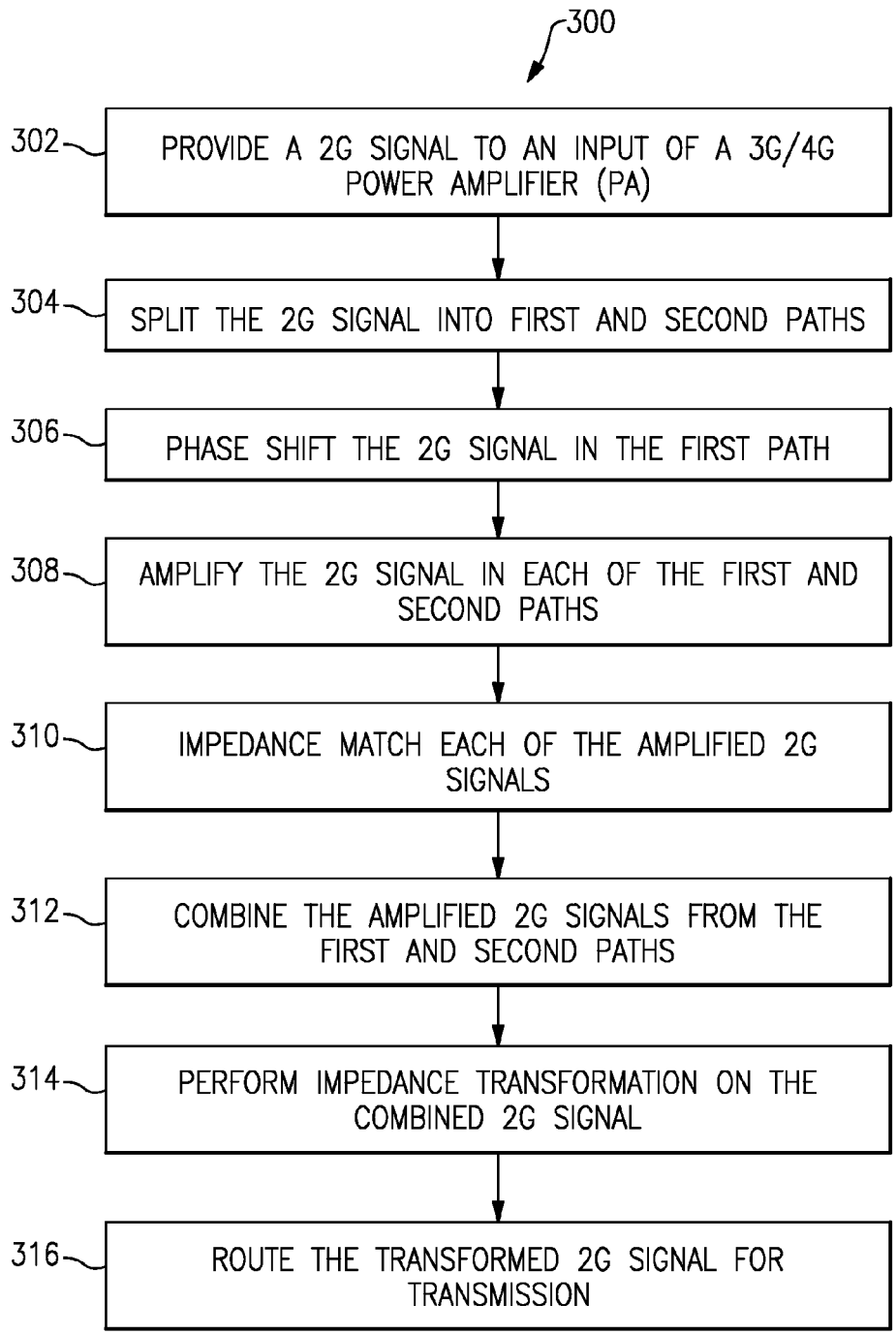
FIG. 13 shows a process that can be implemented to process 2G signals in a 3G/4G power amplifier (PA) engine.

FIG. 13 shows a process 300 that can be implemented to process 2G signals in a 3G/4G PA engine. In block 302, a 2G signal can be provided to an input of a 3G/4G power amplifier (PA). In block 304, the 2G signal can be split into first and second paths. In block 306, a phase shift can be introduced to the 2G signal in the first path. In block 308, the 2G signal in each of the first and second paths can be amplified. In block 310, each of the amplified 2G signals can be impedance matched. In block 312, the amplified 2G signals from the first and second paths can be combined. In block 314, impedance transformation can be performed on the combined 2G signal. In block 316, impedance transformed 2G signal can be routed to an antenna for transmission.

In some embodiments, one or more features associated with 2G amplification using 3G4G path combination as described herein can be implemented in a PA system having an interface compatible with inputs that are separated by mode or frequency. Additional details concerning such a PA system are described in U.S. Provisional Application No. 62/038,323 filed Aug. 17, 2014, entitled POWER AMPLIFIER INTERFACE COMPATIBLE WITH INPUTS SEPARATED BY MODE OR FREQUENCY, and its corresponding U.S. Application entitled POWER AMPLIFIER INTERFACE COMPATIBLE WITH INPUTS SEPARATED BY MODE OR FREQUENCY, each of which is expressly incorporated by reference in its entirely, and which is to be considered part of the specification of the present application.

Figure 14:
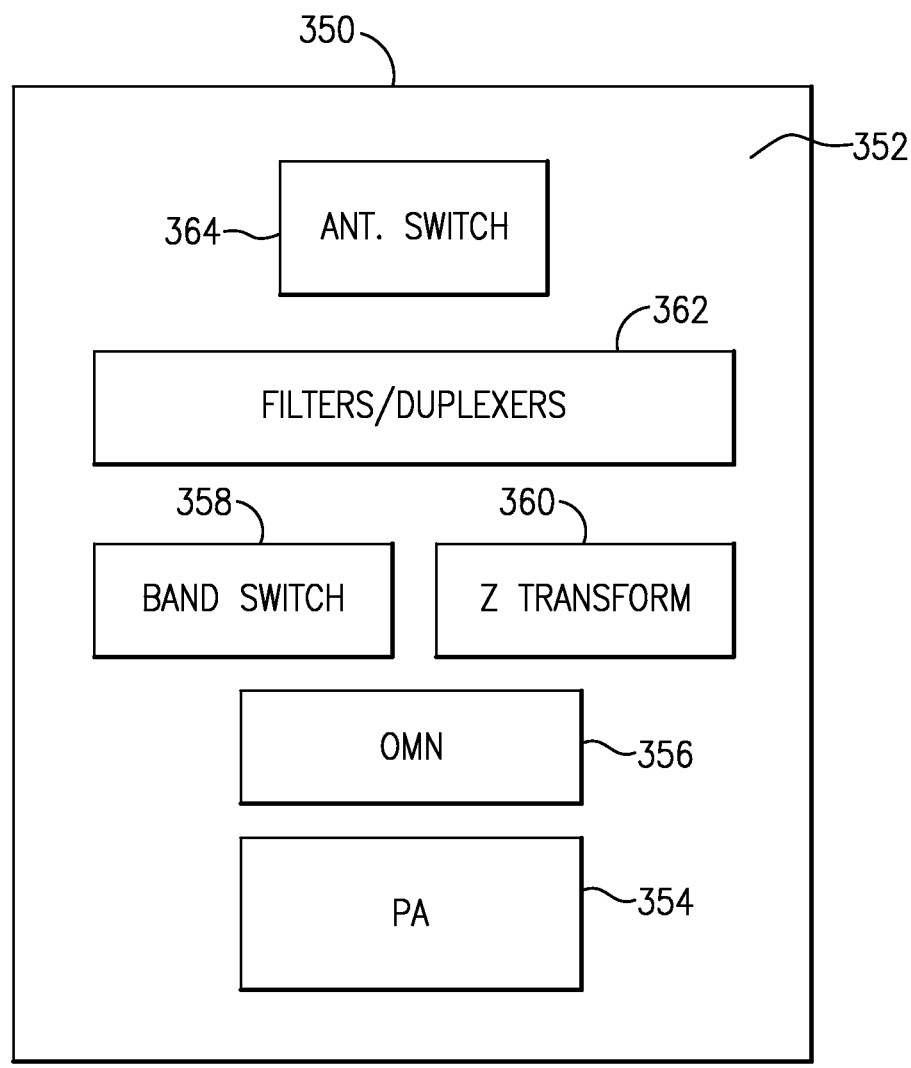
FIG. 14 shows that in some embodiments, some of all of the 3G/4G architecture as described herein can be implemented as a packaged module.

FIG. 14 shows that in some embodiments, some of all of the 3G/4G architecture as described herein can be implemented as a packaged module. For example, a front-end module (FEM) 350 can include a packaging substrate 352 configured to receive a plurality of components. Such components include, for example, a PA die 354 having a plurality of amplification paths to facilitate 3G/4G MMMB operations. In situations where 2G PAs are traditionally implemented on such a die, some or all of such 2G PAs can be eliminated, and 2G functionalities can be achieved, by utilizing one or more of the techniques described herein. Accordingly, such a PA die size and cost can be reduced. In situations where 2G PAs are traditionally implemented on a separate die, such a die can be reduced in size or eliminated for similar reasons. Accordingly, the module size and cost can be reduced. It is further noted that one or more components that are traditionally mounted on the packaging substrate 352 to facilitate 2G impedance matching and/or filtering functionalities can also be reduced or eliminated, thereby reducing the module size and cost.

The example FEM 350 is shown to further include a band selection switch 358. As described herein, such a switch can be configured to provide combining functionality for 2G signals routed to two or more amplification paths.

The example FEM 350 is shown to further include an impedance transformer 360. As described herein, such a transformer can be configured to improve the output power for transmission of 2G signals processed through a 3G/4G engine.

The example FEM 350 is shown to further include an assembly of filters and duplexers 362. Such filters and duplexers can provide filtering and duplexing functionalities for 3G/4G signals, as well as 2G signals processed through the 3G/4G engine.

The example FEM 350 is shown to further include an antenna switch 364. Such a switch can be configured to route various 3G/4G signals, as well as 2G signals being transmitted.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 15:
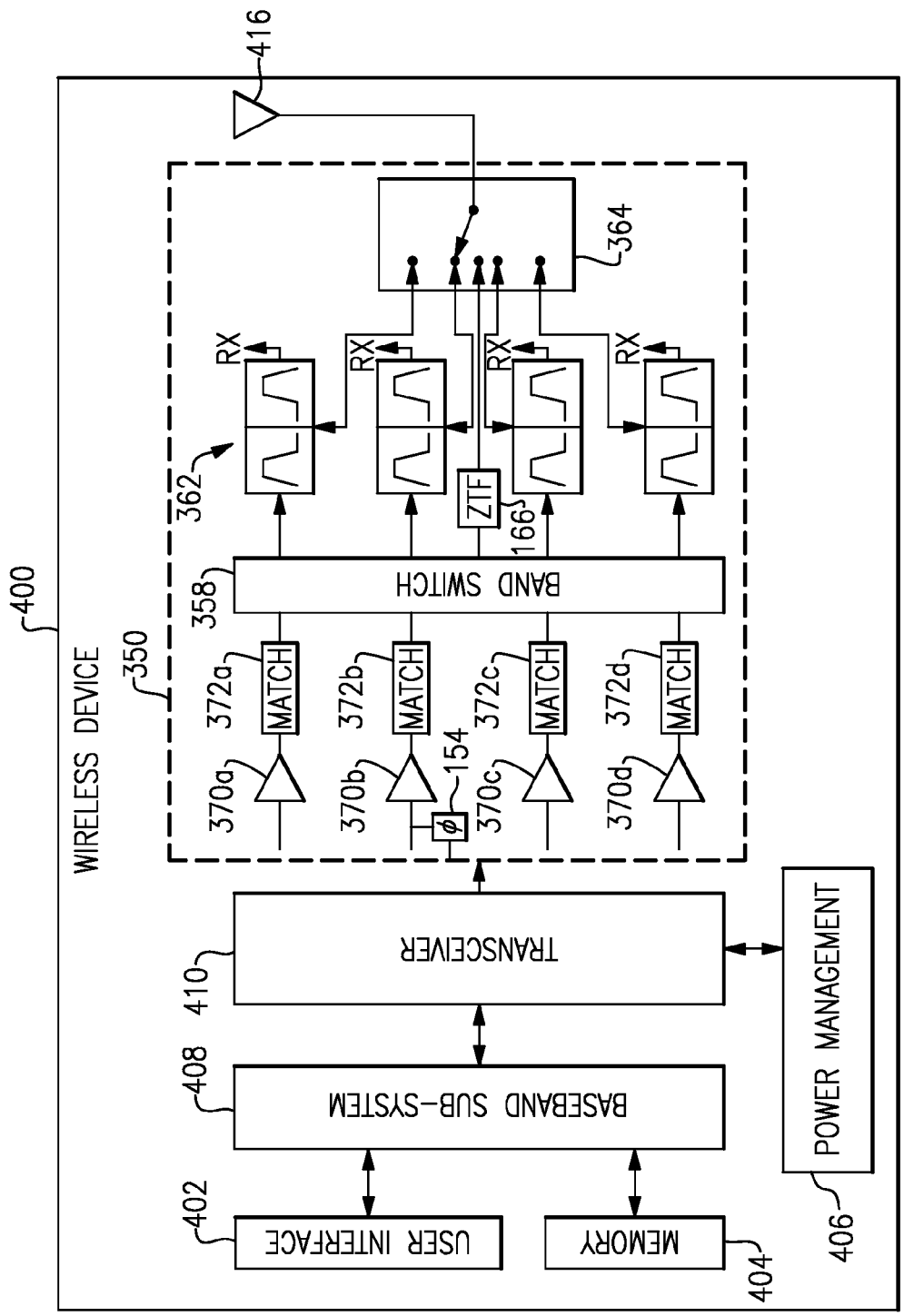
FIG. 15 depicts an example wireless device having one or more advantageous features described herein.

FIG. 15 depicts an example wireless device 400 having one or more advantageous features described herein. In the context of a module having one or more features as described herein, such a module can be generally depicted by a dashed box 350, and can be implemented as a front-end module (FEM) such as a FEM-including-duplexer (FEMiD).

PAs 370 can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device. Such power management can also control operations of the baseband sub-system 408 and the module 350.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 370 are shown to be matched (via respective match circuits 372) and routed to an antenna 416 through a band selection switch 358, their respective duplexers 362 and an antenna switch 364. In some embodiments, each duplexer 362 can allow transmit and receive operations to be performed simultaneously using a common antenna (e.g., 416). In FIG. 15, received signals are shown to be routed to "Rx" paths (not shown) that can include, for example, a low-noise amplifier (LNA).

In the example wireless device 400, one or more phase shifting circuits 154 can be implemented at input(s) of the PA(s) 370 to facilitate processing of 2G signals as described herein. Further, the band selection switch 358 can be configured to provide combining functionality for two or more amplification paths as described herein. Further, an impedance transformer 166 can be implemented at a combined path from the band selection switch 358 to facilitate processing of 2G signals as described herein. In some embodiments, such an impedance transformer can be routed directly to the antenna switch 364 so as to allow transmission through the antenna 416.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:
1. A front-end architecture comprising:
a first amplification path having a first power amplifier configured to support either or both of 3G and 4G modes and including a phase shifting circuit;

a second amplification path having a second power amplifier configured to support either or both of 3G and 4G modes;

a splitter configured to receive a 2G signal at a common input and split the 2G signal into the first and second amplification paths, such that the first and second power amplifiers amplify respective portions of the 2G signal;

a combiner configured to combine the respective amplified 2G signals from the first and second power amplifiers into a common output path to provide a combined 2G signal; and an impedance transformer implemented along the common output path to provide a desired impedance for the combined 2G signal.

2. The front-end architecture of claim 1 wherein the splitter includes a first switch between the common input and the first amplification path, and a second switch between the common input and the second amplification path.

3. The front-end architecture of claim 2 wherein the splitter is configured such that each of the first and second switches is closed when the 2G signal is received at the common input and split into the first and second amplification paths.

4. The front-end architecture of claim 1 wherein the phase shifting circuit is on the input side of the power amplifier.

5. The front-end architecture of claim 4 wherein the phase shifting circuit includes an inductance and a capacitance that couples each end of the inductance to ground.

6. The front-end architecture of claim 1 wherein each of the first and second amplification paths further includes an output matching network.

7. The front-end architecture of claim 6 wherein each output matching network includes an inductance and a capacitance that couples the output side of the inductance to ground.

8. The front-end architecture of claim 1 wherein the combiner is part of a band selection switch on the output side of the power amplifiers of the first and second amplification paths.

9. The front-end architecture of claim 8 wherein the band selection switch includes a pole connected to each of the first and second amplification paths.

10. The front-end architecture of claim 9 wherein the pole connected to the corresponding amplification path is an existing pole for 3G/4G operation.

11. The front-end architecture of claim 9 wherein the band selection switch further includes a throw connected to the impedance transformer.

12. The front-end architecture of claim 11 wherein the band selection switch is configured to connect each pole associated with the corresponding amplification path to the throw associated with the impedance transformer.

13. The front-end architecture of claim 1 wherein the impedance transformer includes a first inductance and a second inductance connected in series, a first capacitance that couples a node between the first and second inductances to ground, and a second capacitance that couples the output side of the second inductance to ground.

14. The front-end architecture of claim 1 wherein the first and second amplification paths are configured to amplify low band and very low band 3G/4G signals, respectively.

15. A front-end module comprising:

a packaging substrate configured to receive a plurality of components;

a power amplifier die mounted on the packaging substrate and including a first amplification path having a first power amplifier configured to support either or both of 3G and 4G modes, and a second amplification path having a second power amplifier configured to support either or both of 3G and 4G modes, the first amplification path including a phase shifting circuit;

a splitter configured to receive a 2G signal at a common input and split the 2G signal into the first and second amplification paths, such that the first and second power amplifiers amplify respective portions of the 2G signal;

a band selection switch configured to combine the respective amplified 2G signals from the first and second power amplifiers into a common output path to provide a combined 2G signal; and an impedance transformer implemented along the common output path to provide a desired impedance for the combined 2G signal.

16. The front-end module of claim 15 wherein the power amplifier die is substantially free of a dedicated 2G amplification path for amplifying the 2G signal.

17. A wireless device comprising:

a transceiver;

a front-end architecture in communication with the transceiver and including a first amplification path having a first power amplifier configured to support either or both of 3G and 4G modes, and a second amplification path having a second power amplifier configured to support either or both of 3G and 4G modes, the first amplification path including a phase shifting circuit, the front-end architecture further including a splitter configured to receive a 2G signal at a common input and split the 2G signal into the first and second amplification paths, such that the first and second power amplifiers amplify respective portions of the 2G signal, the front-end architecture further including a combiner configured to combine the respective amplified 2G signals from the first and second power amplifiers into a common output path to provide a combined 2G signal, the front-end architecture further including an impedance transformer implemented along the common output path to provide a desired impedance for the combined 2G signal; and an antenna in communication with the front-end architecture and configured to facilitate transmission of at least the combined 2G signal.

18. The wireless device of claim 17 wherein the wireless device is a cellular phone.

19. The wireless device of claim 18 wherein the cellular phone is a 3G/4G device having 2G capability.

* * * * *